United States Patent
Tangirala et al.

(10) Patent No.: US 9,287,119 B2
(45) Date of Patent: Mar. 15, 2016

(54) NANOCOMPOSITE AND METHOD OF MAKING THEREOF

(75) Inventors: Ravisubhash Tangirala, Mountain View, CA (US); Delia J. Milliron, Oakland, CA (US); Anna Llordes, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 17 days.

(21) Appl. No.: 13/446,289

(22) Filed: Apr. 13, 2012

(65) Prior Publication Data
US 2012/0273719 A1 Nov. 1, 2012

Related U.S. Application Data

(63) Continuation-in-part of application No. PCT/US2010/052739, filed on Oct. 14, 2009.

(60) Provisional application No. 61/251,634, filed on Oct. 14, 2009.

(51) Int. Cl.
*H01B 1/02* (2006.01)
*H01L 21/02* (2006.01)
(Continued)

(52) U.S. Cl.
CPC .......... *H01L 21/02587* (2013.01); *B82Y 30/00* (2013.01); *B82Y 40/00* (2013.01);
(Continued)

(58) Field of Classification Search
CPC ........ B82Y 30/00; B82Y 20/00; B82Y 10/00; C08L 83/04; G02B 1/045; H01B 1/08; H01B 1/14
USPC .......................................... 252/519.14, 519.4
See application file for complete search history.

(56) References Cited

U.S. PATENT DOCUMENTS 6,875,661 B2   4/2005 Mitzi et al.
6,878,871 B2   4/2005 Scher et al.
(Continued)

FOREIGN PATENT DOCUMENTS

JP   2003-286292   10/2003
JP   2005-538573   12/2005
(Continued)

OTHER PUBLICATIONS

Streb, C., et al., "Supramolecular Silver Polyoxometalate Architectures Direct the Growth of Composite Semiconducting Nanostructures," Angew. Chem. Int. Ed., 2009, 48, 6490-6493.*
(Continued)

*Primary Examiner* — Harold Pyon
*Assistant Examiner* — William Young
(74) *Attorney, Agent, or Firm* — Weaver Austin Villeneuve & Sampson LLP

(57) ABSTRACT

An embodiment of an inorganic nanocomposite includes a nanoparticle phase and a matrix phase. The nanoparticle phase includes nanoparticles that are arranged in a repeating structure. In an embodiment, the nanoparticles have a spherical or pseudo-spherical shape and are incompatible with hydrazine. In another embodiment, the nanoparticles have neither a spherical nor pseudo-spherical shape. The matrix phase lies between the nanoparticles of the nanoparticle phase. An embodiment of a method of making an inorganic nanocomposite of the present invention includes forming a nanoparticle superlattice on a substrate. The nanoparticle superlattice includes nanoparticles. Each nanoparticle has organic ligands attached to a surface of the nanoparticle. The organic ligands separate adjacent nanoparticles within the nanoparticle superlattice. The method also includes forming a solution that includes an inorganic precursor. The nanoparticle superlattice is placed in the solution for a sufficient time for the inorganic precursor to replace the organic ligands.

11 Claims, 9 Drawing Sheets

(51) Int. Cl.

| | | |
|---|---|---|
| *B82Y 30/00* | (2011.01) | |
| *B82Y 40/00* | (2011.01) | |
| *C01B 17/20* | (2006.01) | |
| *C01B 19/00* | (2006.01) | |
| *C01G 3/12* | (2006.01) | |
| *C01G 33/00* | (2006.01) | |
| *C04B 35/622* | (2006.01) | |
| *C04B 35/626* | (2006.01) | |
| *C04B 35/632* | (2006.01) | |
| *H01L 31/0352* | (2006.01) | |
| *H01L 31/0749* | (2012.01) | |
| *H01B 1/08* | (2006.01) | |
| *H01B 1/14* | (2006.01) | |

(52) U.S. Cl.
CPC .............. *C01B 17/20* (2013.01); *C01B 19/002* (2013.01); *C01B 19/007* (2013.01); *C01G 3/12* (2013.01); *C01G 33/00* (2013.01); *C04B 35/6264* (2013.01); *C04B 35/62272* (2013.01); *C04B 35/632* (2013.01); *H01L 31/035227* (2013.01); *H01L 31/0749* (2013.01); *C01P 2002/72* (2013.01); *C01P 2004/03* (2013.01); *C01P 2004/04* (2013.01); *C01P 2004/16* (2013.01); *C01P 2004/32* (2013.01); *C04B 2235/3284* (2013.01); *C04B 2235/526* (2013.01); *C04B 2235/5264* (2013.01); *H01B 1/08* (2013.01); *H01B 1/14* (2013.01); *Y02E 10/541* (2013.01)

(56) References Cited

U.S. PATENT DOCUMENTS

| | | | | |
|---|---|---|---|---|
| 7,094,651 | B2 | 8/2006 | Mitzi et al. | |
| 7,341,917 | B2 | 3/2008 | Milliron et al. | |
| 7,494,841 | B2 | 2/2009 | Mitzi et al. | |
| 7,517,718 | B2 | 4/2009 | Mitzi et al. | |
| 7,603,003 | B2 | 10/2009 | Bureatea et al. | |
| 7,964,481 | B2 | 6/2011 | Mitzi et al. | |
| 8,121,162 | B2* | 2/2012 | Eisler et al. | 372/43.01 |
| 8,226,740 | B2* | 7/2012 | Chaumonnot et al. | 75/252 |
| 2006/0040103 | A1 | 2/2006 | Whiteford et al. | |
| 2006/0211152 | A1* | 9/2006 | Peng et al. | 438/3 |
| 2007/0153357 | A1 | 7/2007 | Noh et al. | |
| 2007/0181906 | A1 | 8/2007 | Chik et al. | |
| 2008/0124833 | A1 | 5/2008 | Ruiz et al. | |
| 2008/0190325 | A1* | 8/2008 | Kohler et al. | 106/499 |
| 2009/0236594 | A1* | 9/2009 | Mitzi et al. | 257/42 |
| 2012/0273719 | A1 | 11/2012 | Tangirala et al. | |

FOREIGN PATENT DOCUMENTS

| | | |
|---|---|---|
| JP | 2007-513046 | 5/2007 |
| JP | 2007-185764 | 7/2007 |
| JP | 2007-223030 | 9/2007 |
| JP | 2008-505773 | 2/2008 |
| JP | 2008-515746 | 5/2008 |
| JP | 2009-514993 | 4/2009 |
| JP | 2009522713 | 6/2009 |
| JP | 2010-526007 | 7/2010 |
| JP | 2013-512834 | 4/2013 |
| WO | 2011/047198 | 4/2011 |

OTHER PUBLICATIONS

Cozzoli, P. D., et al., "Synthesis, properties and perspectives of hybrid nanocrystal structures," Chem. Soc. Rev., 2006, 35, 1195-1208.*

International Search Report and Written Opinion issued in Application No. PCT/US 10/52739, dated Dec. 10, 2010.

European Supplemental Search Report dated Apr. 29, 2013, issued in Application No. 10 82 4124.

Tangirala et al., "Modular Inorganic Nanocomposites by Conversion of Nanocrystal Superlattices," *Angew. Chem. Int. Ed.*, 2010, vol. 49, 2878-2882.

Andersson et al., "Ag/AgCl-Loaded Ordered Mesoporous Anatase for Photocatalysis," *Chem. Mater.*, vol. 17, No. 6, 2005, pp. 1409-1415.

Urban, et al., Syncrgismin Binary Nanocrystal Superlattices Leads to Enhanced P-Type Conductivity in Self-Assembled PbTe/Ag2Te Thin Films, *Nature Materials*, vol. 6, Feb. 2007, pp. 115-121.

Chatterjee, S., "Titania—Germanium Nanocomposite as a Thermoelectric Material," *Materials Letters*, vol. 62, 2008, pp. 707-710.

Kozicki, et al., "Mass Transport in Chalcogenide Electrolyte Films—Materials and Applications," *Journal of Non-Crystalline Solids*, vol. 352, 2006, pp. 567-577.

Bae et al., "Preparation and Characterization of Fouling-Resistant $TiO_2$ Self-Assembled Nanocomposite Membranes," *Journal of Membrane Science*, vol. 275, 2006, pp. 1-5.

Vaia et al., "Polymer Nanocomposites with Prescribed Morphology: Going beyond Nanoparticle-Filled Polymers," *Chem. Mater.*, 2007, vol. 19, pp. 2736-2751.

Balazs et al., "Nanoparticle Polymer Composites: Where Two Small Worlds Meet," *Science*, vol. 3145, pp. 1107-1110.

Sudeep et al., Polymer-Nanoparticle Composites: Preparative Methods and Electronically Active Materials, *Polymer Reviews*, vol. 47, 2007, pp. 155-163.

Kovalenko, MV, et al. "Colloidal Nanocrystals with Molecular Metal Chalcogenide Surface Ligands," *Science*, 2009, vol. 324, vol. 1417-1420.

Huynh et al., "CDSE Nanopcrystal Rods/Poly (3-Hexylthiophene) Composite Photovoltaic Devices," Proceedings of the International Symposium Photovoltaics for the $21^{st}$ Century, Electrochemical Society Proceedings, vol. 99, No. 11, May 1, 1999, pp. 86-90.

Dong et al., "A Generalized Ligand-Exchange Strategy Enabling Sequential Surface Functionalization of Colloidal Nanocrystals," *J. Am. Chem. Soc.*, 2011, vol. 133, pp. 998-1006.

Llordes et al., "Polyoxometalates and Colloidal Nanocrystals as Building Blocks for Metal Oxide Nanocomposite Films," *J. Mater. Chem.*, 2011, vol. 21, pp. 11631-11638.

Non-Final Office Action dated Oct. 29, 2014, issued in U.S. Appl. No. 14/261,329.

Japanese Office Action mailed Jan. 20, 2015, for Application No. 2012-534376.

Office Action dated Mar. 18, 2015, issued in U.S. Appl. No. 14/261,329.

\* cited by examiner

NANOCOMPOSITE AND METHOD OF MAKING THEREOF

RELATED APPLICATIONS

This continuation-in-part United States non-provisional patent application claims the benefit of priority to PCT Application Number PCT/US2010/052739, filed Oct. 14, 2010, which in turn claims priority to U.S. Provisional Patent Application Ser. No. 61/251,634, filed Oct. 14, 2009, the content of both applications incorporated herein by reference as if fully set forth herein in their entirety.

STATEMENT OF GOVERNMENT SUPPORT

This invention was made with government support under Contract No. DE-AC02-05CH11231 awarded by the U.S. Department of Energy. The government has certain rights in this invention.

BACKGROUND OF THE INVENTION

The present invention relates to the field of nanotechnology and, more particularly, to the field of nanocomposites.

Inorganic nanocomposites have recently emerged as a means of controlling material functionality through morphology, as well as composition, to give rise to combinations of properties not generally found in homogeneous single-phase materials. For example, battery electrodes must efficiently conduct both electrons and ions to achieve high power, while, conversely, thermoelectric energy conversion is most efficient when electrical conductivity is high, yet thermal conductivity is low. However, the development of nanocomposites for such applications is hindered by the lack of a general fabrication method capable of controlling morphology over a wide range of compositions. Recently, exquisite control over colloidal nanocrystal assembly has been developed, including highly ordered superlattices (Pileni, *J. Phys. Chem. B* 105, 3358-3371 (2001)), binary nanocrystal assemblies (Shevchenko et al., *Nature* 439, 55-59 (2006); and Smith et al., *J. Am. Chem. Soc.* 131, 3281-3290 (2009)), and oriented nanorod assemblies (Cozzoli et al., *Chem. Soc. Rev,* 35, 1195-1208 (2006); Ryan et al., *Nano Lett.* 6, 1479-1482 (2006); Gupta et al., *Nano Let.* 2066-2069 (2006); and He, J. et al. *Small* 3, 1214-1217 (2007)).

These methods for assembling organic-ligand terminated nanocrystals have been refined over the last decade or so. For example, vertically oriented arrays of semiconductor nanorods have been prepared by controlled evaporation, electric field orientation, or evaporation at the air-water interface, all of which depend on the organic ligand coating to mediate nanorod interactions with each other and their environment. Similarly, control over binary nanocrystal assemblies was found to depend critically on the presence of ligands (Shevehenko et al.). Recently, electronic applications of nanocrystal assemblies have gained momentum since it was demonstrated that their conductivity can be greatly enhanced by post-assembly replacement of bulky organic ligands with much smaller molecules, such as hydrazine (Talapin et al., *Science* 310, 86-89 (2005)) or ethylenediamine (Murphy et al., *J. Phys. Chem. B* 110, 25455-25461 (2006)). This process takes full advantage of nanocrystal assembly techniques so that, for example, heterogeneous doping could be observed in binary assemblies of $Ag_2Te$ and PbTe nanocrystals (Kang et al., *Nature* 458, 190-193 (2009)). However, the electronic properties of such materials are strongly history-dependent due to the reactivity and volatility of the small molecules employed (Talapin et al.).

Compelled by the unique properties achievable in inorganic nanocomposites, several approaches to their fabrication have been demonstrated for specific applications. For example, spinodal decomposition and precipitation of a secondary phase of PbS within a PbTe matrix was used to generate a nanostructured thermoelectric composite (Androulakis et al., *J. Am. Chem. Soc.* 129, 9780-9788 (2007)). While remarkable improvements in thermoelectric efficiency resulted, the ability to tune morphological characteristics such as the size of the nano-inclusions is limited and the achievable compositions are severely restricted. A more general approach, which has been applied to battery electrodes, is to mechanically mill the component materials until they intermix on the nanoscale (Badway et al., *J. Electrochem. Soc.* 150, A1209-A1218 (2003)). The cost of generality, however, is a failure to reliably create intimate contact between the components, and morphology is again poorly controlled.

Another elegant example is the co-assembly of solution-processed building blocks into ordered arrays of gold nanoparticles within a silica matrix, which provides thermal stability (Fan et al, *Science* 304, 567-571 (2004)). However, this method cannot be applied to arbitrary compositions since it relies on the carefully balanced interaction of the two components, together with a structure-directing surfactant, under dynamic solvent evaporation conditions.

Finally, in a recent report, solution-phase ligand exchange in a strongly reducing environment was used to adsorb CMCs to the surfaces of dispersed nanocrystals (Kovalenko et al., *Science* 324, 1417-1420 (2009)). These could then be deposited to form composite films, although the harsh chemical environment limits the compositional applicability and general approaches to assemble charged nanocrystals are lacking Underscoring these limitations, in only one case gold nanoparticles with Sn—S ligands—was preparation of an ordered assembly demonstrated and no evidence for ordering on a large scale was reported.

SUMMARY OF THE INVENTION

Embodiments of the present invention include an inorganic nanocomposite and a method of making an inorganic nanocomposite. According to an embodiment, an inorganic nanocomposite of the present invention includes nanoparticle phase and a matrix phase. The nanoparticle phase includes nanoparticles that are arranged in a repeating structure. In an embodiment, the nanoparticles have a spherical or pseudo-spherical shape and are incompatible with hydrazine. In another embodiment, the nanoparticles have neither a spherical nor pseudo-spherical shape. The matrix phase lies between the nanoparticles of the nanoparticle phase. In an exemplary embodiment, the nanoparticles include a metal oxide.

According to an embodiment, a method of making an inorganic nanocomposite of the present invention includes forming a nanoparticle superlattice on a substrate. The nanoparticle superlattice includes nanoparticles. Each nanoparticle has organic ligands attached to a surface of the nanoparticle. The organic ligands separate adjacent nanoparticles within the nanoparticle superlattice. The method also includes forming a solution that includes an inorganic precursor. The nanoparticle superlattice is placed in the solution for a sufficient time for the inorganic precursor to replace the organic ligands. In an exemplary embodiment, the inorganic precursor comprises polyoxomtallate clusters. In an exemplary embodiment, the nanoparticles include a metal oxide.

BRIEF DESCRIPTION OF THE DRAWINGS

The present invention is described with respect to particular exemplary embodiments thereof and reference is accordingly made to the drawings in which.

DETAILED DESCRIPTION OF THE INVENTION

Figure 1:
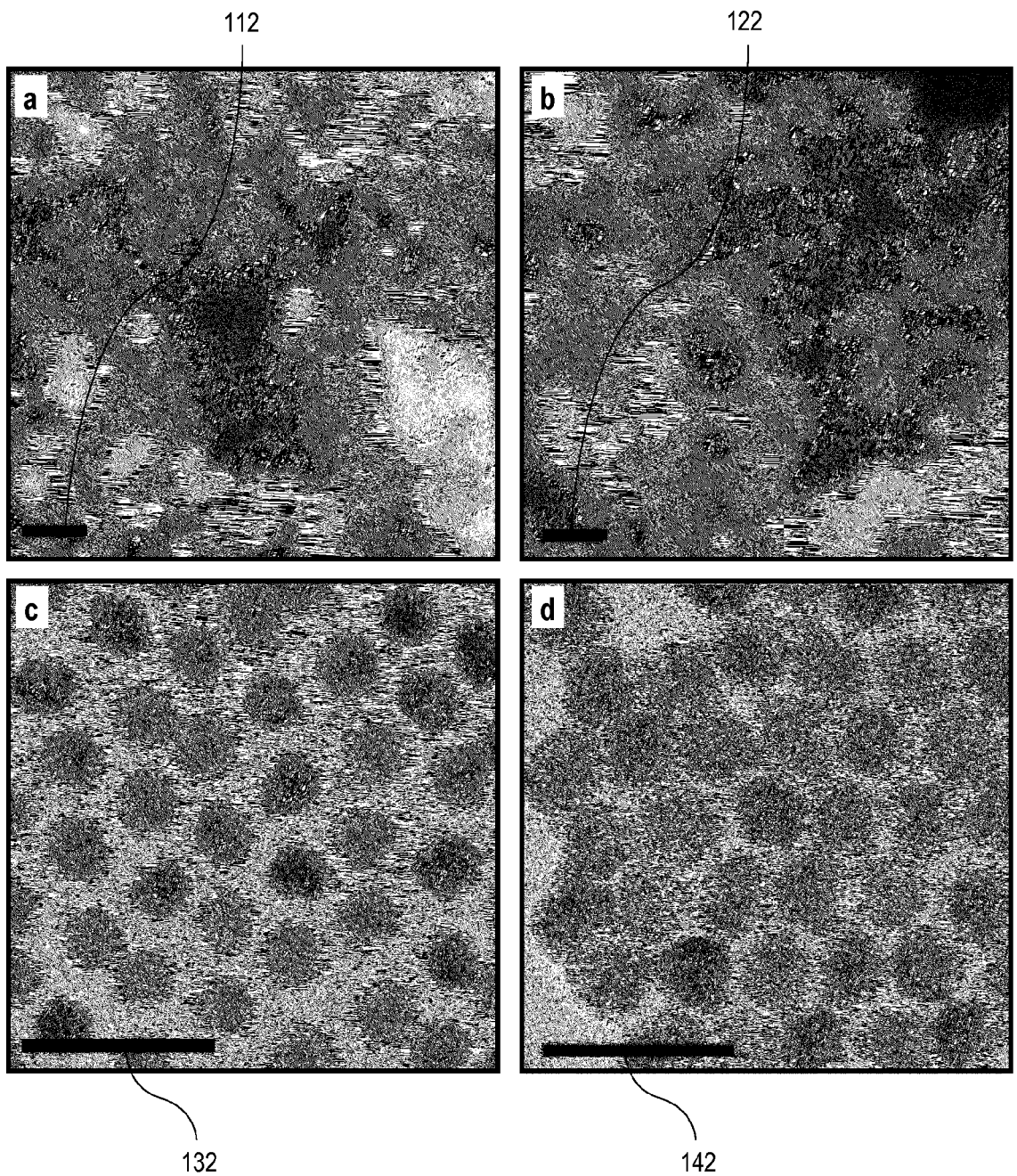
FIG. 1a is an SEM image of a PbSe superlattice in accordance with the present invention.
FIG. 1b is a SEM image of the PbSe superlattice after ligand exchange with an Sb—Se CMC in accordance with the present invention.
FIG. 1c is a TEM image of a PbSe nanocrystal superlattice in accordance with the present invention.
FIG. 1d is a TEM image of a PbSe—$Sb_2Se_3$ nanocomposite film in accordance with the present invention.

Embodiments of the present invention include an inorganic composite and a method of making an inorganic composite.

An embodiment of a method of making an inorganic composite of the present invention includes forming a nanoparticle superlattice on a substrate. The nanoparticle superlattice includes nanoparticles in which each nanoparticle has organic ligands attached to a surface of the nanoparticle. The organic ligands separate adjacent nanoparticles within the nanoparticle superlattice. The nanoparticles may comprise a metal chalcogenide, metal, a metal oxide, or some other suitable material. For example, the metal of the metal chalcogenide may be selected from Pb, Ag, Cd, and some other suitable metal. According to embodiments, the chalcogen of the metal chalcogen is selected from S, Se, and Te. In an embodiment, the nanoparticle superlattice is formed by applying a solution that includes the nanoparticles to the substrate and drying it. As used herein, the term "nanoparticles" is generic for individual units having a structure in which at least one dimension is on a nanometer scale (i.e. from 1 nm up to 1 μm). The term "nanoparticles" includes quantum dots, spherical and pseudo-spherical particles, faceted particles, nanorods, nanowires, tetrapods, anisotropic particles, and other suitable particles. Further, the term "nanoparticles" includes single crystal nanoparticles (i.e. nanocrystals), polycrystalline nanoparticles, and amorphous nanoparticles.

In an embodiment, the nanoparticles are arranged in a close packed structure. For example, the nanoparticles may be spherical or pseudo-spherical particles arranged in a hexagonal close packed structure or a face centered cubic structure. Another example is nanorods that are aligned vertically on the substrate are close packed in a plane orthogonal to axes of the nanorods.

The method further includes forming a precursor solution that includes an inorganic precursor. The inorganic precursor may be selected from chalcogenidometallate clusters, a sol-gel precursor, or another suitable inorganic precursor. A solvent for the precursor solution may be selected from ethanolamine, DMSO, hydrazine, or some other suitable solvent. The nanoparticle superlattice is placed in the precursor solution for a sufficient time for the inorganic precursor to replace the organic ligands. In an embodiment, the solvent is chosen so that it is a poor dispersing solvent for the nanoparticles of nanoparticle superlattice so that the nanoparticle superlattice remains intact during processing.

According to an embodiment, the inorganic precursor is a chalcogenidometallate cluster, which is made by dissolving inorganic salts in hydrazine in the presence of extra chalcogen (e.g., S, Se, or Te) and then drying it to remove the hydrazine.

It will be readily apparent to one skilled in the art that the sufficient time for replacement of the organic ligands with the inorganic precursor is something that is routinely determined in process refinement. While it will vary depending upon materials used in the method, it has a definite time for particular materials.

According to an embodiment, the method further includes removing the superlattice from the solution and rinsing the superlattice to remove the solvent, organic materials, and an excess of the inorganic precursor. According to an embodiment, the method includes heating the nanoparticle superlattice to convert the inorganic precursor to a matrix phase of an inorganic nanocomposite. In this embodiment, the nanoparticle superlattice forms a nanoparticle phase of the inorganic nanocomposite.

In an embodiment, the method further includes removing the substrate from the inorganic nanocomposite. For example, the substrate may be separated from the inorganic nanocomposite by selectively etching a sacrificial layer that couples a remainder of the substrate to the inorganic nanocomposite.

In the method of the present invention, the nanoparticle superlattice and the inorganic precursor are processed separately, which allows a wide range of materials to be used for the nanoparticle phase and the matrix phase of the resulting inorganic nanocomposite. In particular, because of the separate processing of the nanoparticle superlattice and the inorganic precursor, the inorganic nanocomposite produced from the method of the present invention can be distinguished from the known work of others in two ways. First, the nanoparticle phase may be formed of nanoparticles that are incompatible with hydrazine. Second, the nanoparticle phase may be produced from nanoparticles that are neither spherical nanoparticles nor pseudo-spherical nanoparticles. Moreover, because the nanoparticles of the nanoparticle superlattice are initially separated from each other by the inorganic ligands, the spacing of the nanoparticles in the resulting inorganic nanocomposite may be controlled more closely than the known work of others. This means that the method of the present invention produces more controllable inorganic-nanocomposite structures. Tins should be useful in fine tuning designs of future devices that incorporate inorganic nanocomposites produced by the method of the present invention.

An embodiment of an inorganic nanocomposite of the present invention includes a nanoparticle phase and a matrix phase. The nanoparticle phase is arranged in a repeating structure (e.g., a close packed structure). In an embodiment, the nanoparticles comprise nanoparticles that have a spherical or pseudo-spherical shape and that are incompatible with hydrazine. In another embodiment, the nanoparticles have neither a spherical nor pseudo-spherical shape.

The present invention also provides for the making of nanocomposites containing metal oxide nanoparticles and metal oxide matrices. The use of metal oxide nanoparticles, particularly those of transparent conducting oxides, expands the range of applications of the present invention to include optical and electrochromic materials. Metal oxide matrices could, in some cases, be expected to be non-reactive, thermally stable and transparent. These could be used to maintain the nanostructure of the composite even under high temperature. The oxide would also be sufficiently thin so as to allow, for example, electron transfer between nanoparticles in the composite. This could be of interest for electronic devices which take advantage of nanostructured properties, such as phase change memory materials. Alternatively, electrochemically active metal oxide matrices could be used to create additional functionality (e.g., for thin film batteries or electrochromics). Importantly, regular particle spacings were found in the nanocomposites made via the present invention, which would be important in controlling electronic and ionic transport through the material for such applications.

Uses

Because of the broad generality of materials combinations possible using the method of the present invention, the applications are diverse. One example is a "resistive switching" memory material which is a nanocomposite of a silver chalcogenide and germanium chalcogenide. These materials are promising for next generation data storage, non-volatile memories, and selector switches. Solution processing like that used here has been demonstrated to be particularly attractive for such technologies since it facilitates the filling of small, high aspect ratio holes with memory materials (U.S. published patent application 20080124833). Companies developing this memory technology include IBM Corporation, Samsung, and others.

Another example is transistors for large area electronics such as active matrix drivers for displays or detectors (e.g., Sony Corporation, Panasonic Corporation, etc.). Solution processing scales well to such large areas and inorganic nanocomposites can perform better and more reliably than solution processed organics or inorganic-organic hybrids such as those made from organic-coated nanoparticles alone.

Thermoelectric materials are known to perform best when nanostructured, and this approach will provide unprecedented flexibility in combining material selections to boost power conversion performance. In photovoltaic cells made from nanomaterials, it is often beneficial to integrate materials with regular, nanoscale spacing between them. The method of the present invention allows n- and p- (or acceptor and donor) type materials to be interspersed with regularity on the nanoscale. This includes vertically oriented nanorods (e.g. CdS) filled with a matrix of a second semiconductor (e.g. $Cu_2S$)—often considered the ideal geometry for a nanomaterials solar cell. As a final example, a nanostructured phase change memory material could be formed using this process. Interfaces in thin films of phase change materials are known to influence their properties and a nanocomposite offers a high density of interfaces to morphologically adjust phase change properties. As with thermoelectrics, the thermal conductivity should be reduced by the nanostructuring. In phase change materials, this has the potential to reduce the critical "RESET" power needed to locally melt the material since the heat applies will be better localized.

Uses of Nanocomposites Comprising Metal Oxide Nanoparticles as Well as Matrix

Nanocomposites comprising metal oxide nanoparticles as well as matrix are promising for applications such as electrochromic window coatings. Separately, nanoparticles of transparent conducting oxides (TCOs) such as doped $SnO_2$, and polyoxometallates such as $Nb_2O_5$ and $WO_3$ have been used for forming electrochromic devices. By combining these two components via the present invention, the present invention could prepare devices with tunable spectral response in the visible and near-infrared (NIR) regimes, with faster switching times, better durability, and higher efficiency. The present invention could also be used to make nanocomposites containing doped tin oxide or zinc oxide nanoparticles dispersed in a niobium oxide matrix for application in electrochromic devices.

Another application of the present invention could be for computer memory. Specifically, the present invention could make components for phase change memory devices or optical media. Such memories could use a metal chalcogenide phase change material as the nanoparticles, and a thermally stable, inert oxide matrix, combined via the present invention. The advantage of such a combination could be that the power needed to reset the device could be reduced by the lower thermal conductivity due to the nanostructuring. Locally, these devices could reach several hundred degrees Celsius during operation. Thus, it would be crucial to stabilize the nanostructure with a stable matrix material (oxide).

EXAMPLES

The present invention provides for the conversion of nanocrystal assemblies into inorganic nanocomposites through post-assembly replacement of organic ligands with inorganic chalcogenidometallate clusters (CMCs). Since the present invention allows for the nanocrystals and CMCs to be synthesized and processed independently, the present invention affords complete compositional modularity. Critically, the morphology of the original nanocrystal assemblies, including oriented nanorod assemblies, is maintained in the resulting nanocomposites. The fabrication of inorganic nanocomposites by conversion of nanocrystal assemblies allows modular selection of composition for targeted electronic applications.

Example 1

For instance, PbSe nanocrystals, ideal for transistors and thermoelectric applications, formed close-packed hexagonal assemblies, via the present invention, in which the particle spacing is initially dictated by the oleic acid ligand coating, as shown in FIG. 1a and FIG. 1c. FIG. 1a, FIG. 1b, FIG. 1c, and FIG. 1d show the formation of a PbSe—$Sb_2Se_3$ nanocomposite from a PbSe nanocrystal superlattice. Namely, FIG. 1a, FIG. 1b, FIG. 1c, and FIG. 1d are SEM images of a PbSe nanocrystal film. In order to convert the PbSe superlattice to an inorganic nanocomposite, the present invention provides for immersing the PbSe superlattice in a CMC solution and allowing the clusters to displace the organic ligands. Targeting a composition of interest for thermoelectrics, the present invention provides for soaking the PbSe superlattices in a Sb—Se CMC solution, and then rinsing the superlattices to remove any superficial Sb—Se. Following the application of the present invention, the nanocrystal superlattices were intact and still readily observable by high resolution scanning electron microscopy (HRSEM), as shown in FIG. 1b and FIG. 1d, but the resulting composition of the assembly, measured by energy dispersive x-ray spectroscopy (EDS), included 8-14% Sb and <5% C. Scale bars 112, 122, 132, and 142 are 20 nm each.

Figure 2:
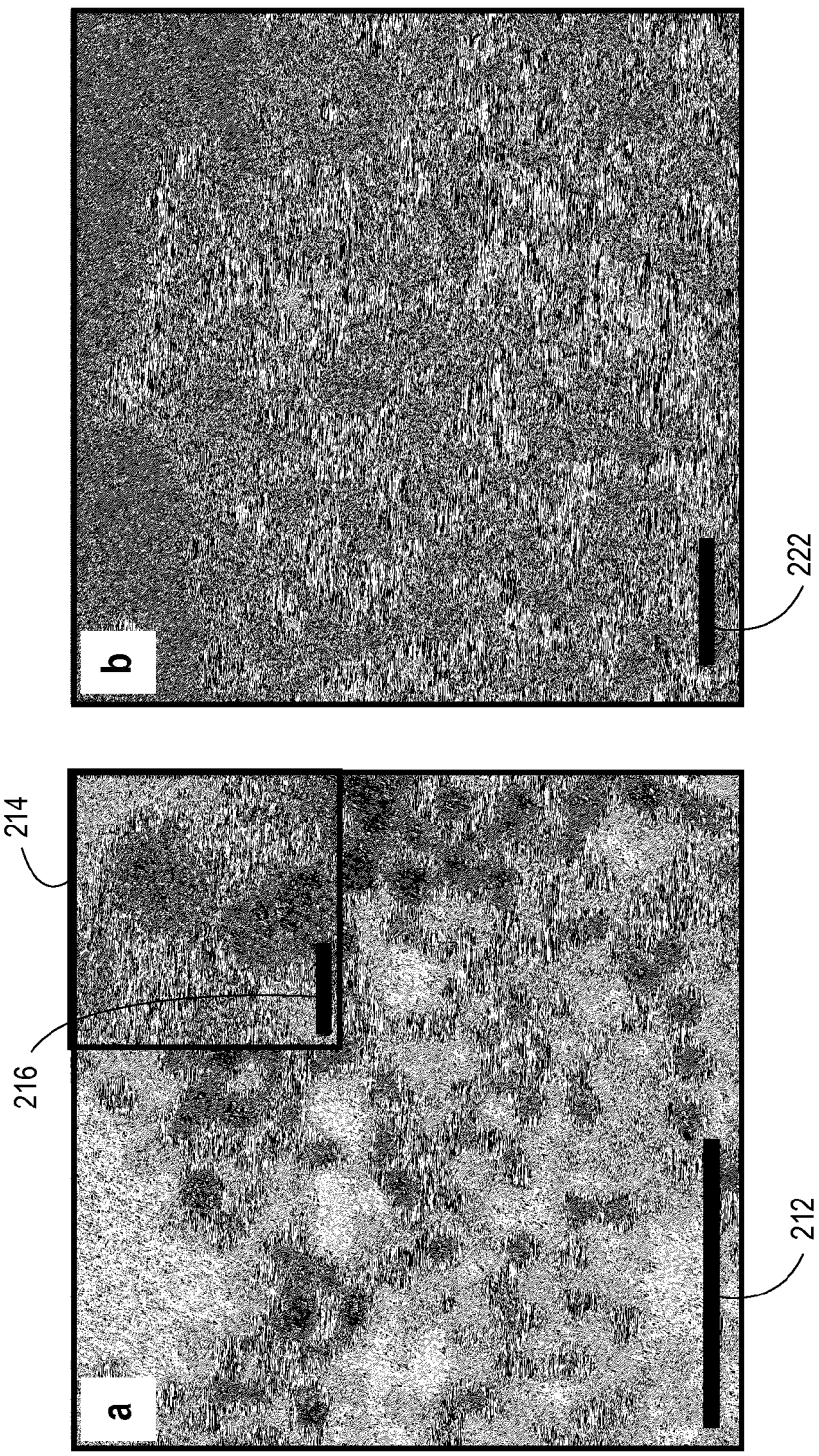
FIG. 2a is a TEM image of PbSe—$GeS_2$ nanocomposites in accordance with the present invention.
FIG. 2b is a SEM image of PbSe—$GeS_2$ nanocomposites in accordance with the present invention.

An analogous composite was prepared via the present invention using a Ge—S CMC. The resulting composite had a composition of 8-10% Ge and 16-20% S (the balance being approximately 1:1 Pb:Se), as shown in FIG. 2a and FIG. 2b. In both cases, the CMC could be cross-linked by thermal annealing (typically at 180° C.), eliminating hydrazinium cations and excess chalcogen to give a pure metal chalcogenide secondary phase. Scale bars 212 and 222 are 50 nm each. Inset 214 in shows a HRTEM image of the nanocomposite produced via the present invention, where scale bar 216 is 5 nm.

Figure 3:
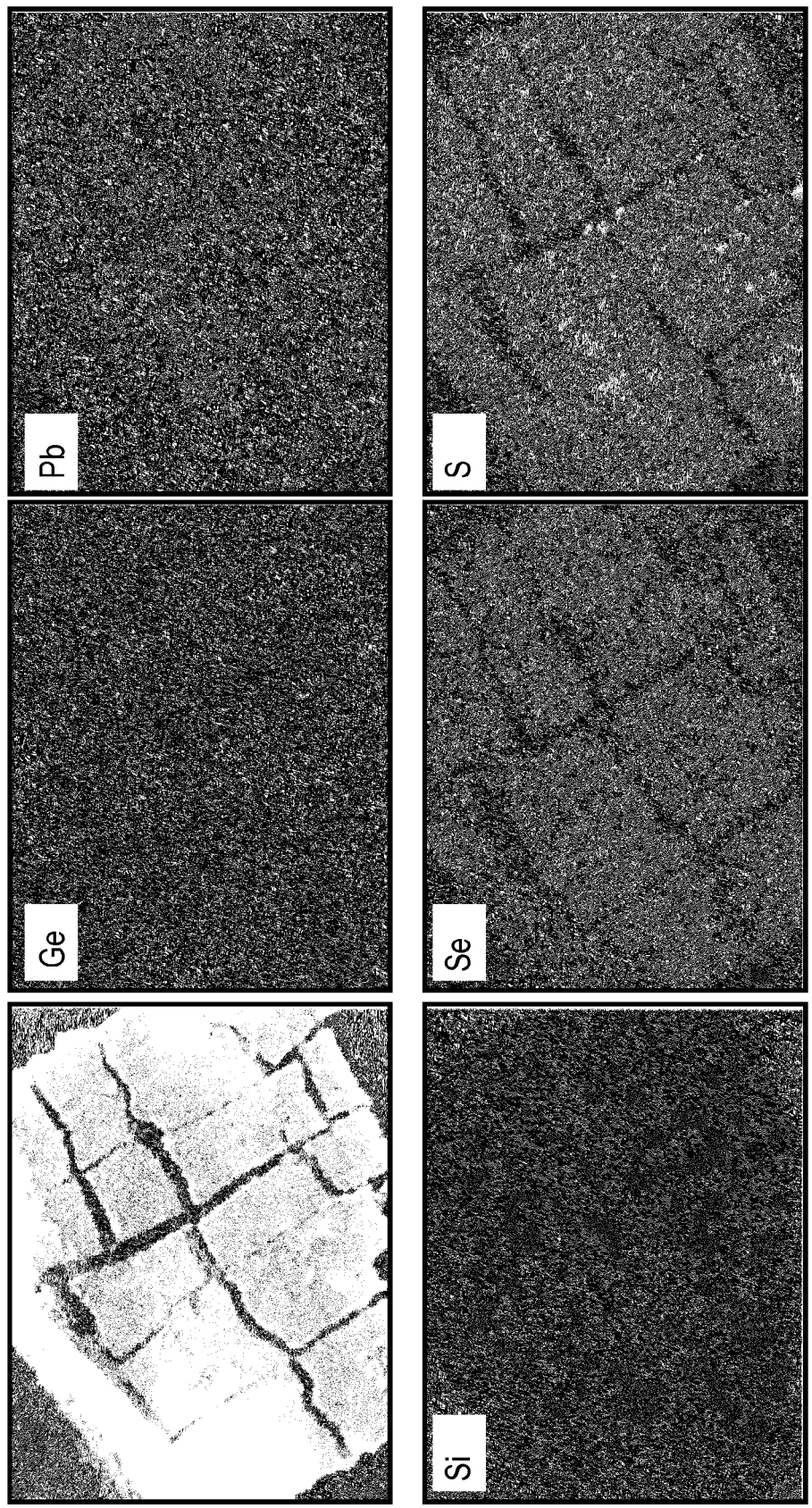
FIG. 3 shows an elemental mapping of a PbSe—$GeS_2$ nanocomposite showing uniform distribution of all the elements, in accordance with the present invention.

Elemental mapping of a PbSe—$GeS_2$ nanocomposite film made via the present invention revealed a uniform composition, with no evidence of phase segregation, as shown in FIG. 3. Parts of the $SiO_2$ substrate are visible through the cracks in the nanocomposite.

Following conversion to a nanocomposite via the present invention, the TEM contrast between the PbSe nanocrystals and the inter-particle material was substantially reduced, consistent with the replacement of the organic ligands with inorganic phase, as shown in FIG. 1c, FIG. 1d, FIG. 2a and FIG. 2b. In addition, while the hexagonal ordering of the nanocrystals was largely maintained, the center-to-center distance decreased from ~10.5 nm to ~8 nm.

The recent report by Talapin and others (Kovalenko et al) demonstrated that CMCs associate with nanocrystal surfaces. The present invention suggests that this cluster-surface interaction facilitates the post-assembly conversion process, resulting in reduced particle spacing, similar to that observed when bulky ligands are displaced by small organic molecules (Talapin et al.; and Murphy et al.) As in that case, contraction during conversion induced cracks, which could be filled in subsequent deposition steps to create a continuous nanocomposite film. This cracking could be minimized by replacing the ligands with shorter, e.g. butyl, chain ligands prior to assembly.

While electron microscopy established that local order was maintained in the conversion from nanocrystal superlattice to inorganic nanocomposite via the present invention, an ensemble approach was needed to evaluate the overall morphology changes induced by the present invention. To that end, grazing incidence small angle x-ray scattering (GISAXS) patterns were recorded, averaging information from a ~0.5×25 mm region of the sample.

Figure 4:
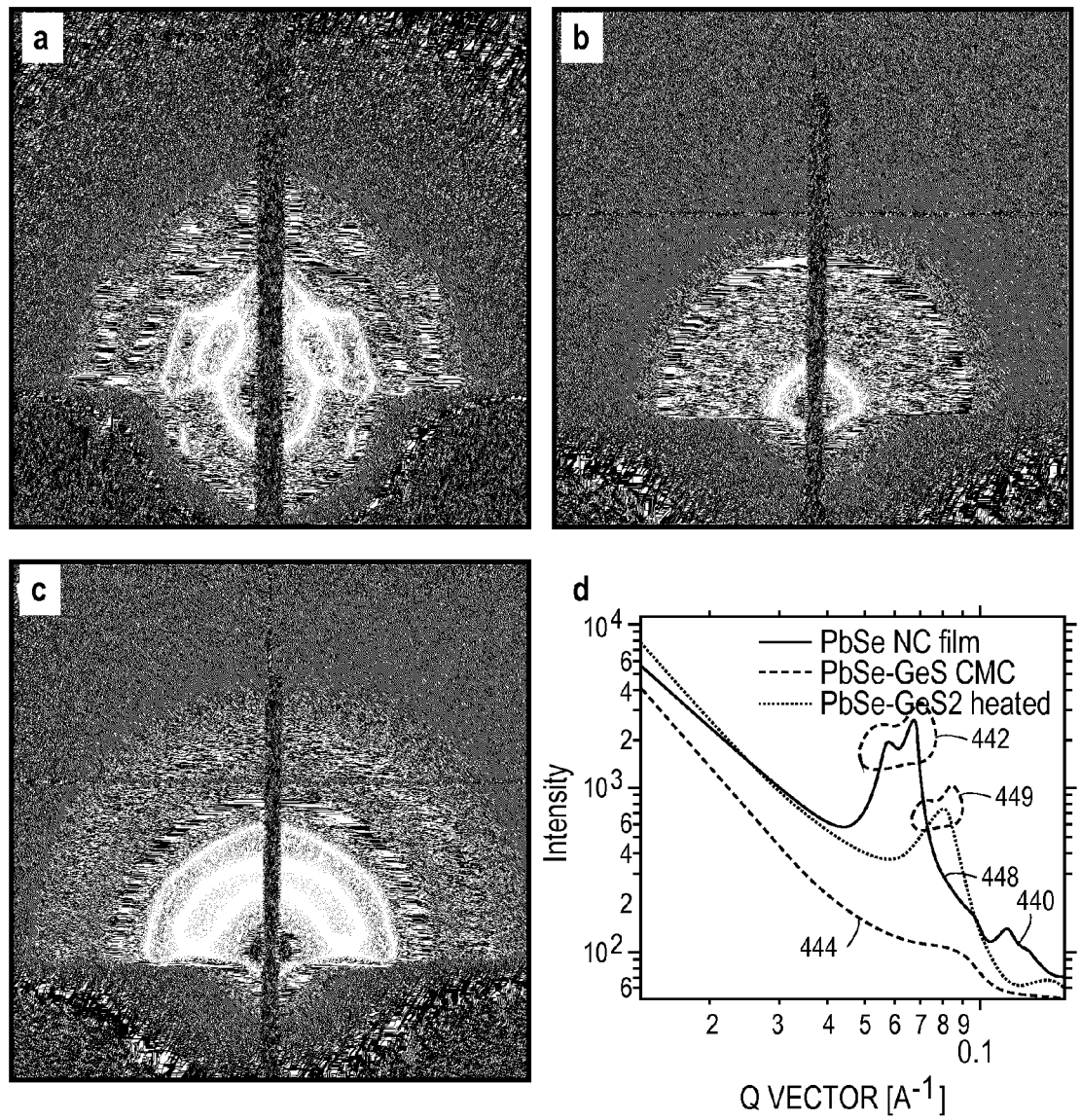
FIG. 4a is a two-dimensional GISAXS pattern obtained from a PbSe nanocrystal superlattice produced by the present invention.
FIG. 4b is a two-dimensional GISAXS pattern obtained from PbSe film soaked in Ge—S CMC solution in accordance with the present invention.
FIG. 4c is a two-dimensional GISAXS pattern obtained from PbSe—$GeS_2$ composite film after annealing in accordance with the present invention.
FIG. 4d shows I(q) vs. q plots for PbSe, for PbSe—GeS, and for PbSE-$GeS_2$ in accordance with the present invention.

FIG. 4a, FIG. 4b, and FIG. 4c show GISAXS patterns from PbSe—$GeS_2$ nanocomposites. The initial PbSe superlattice had a highly textured scattering pattern, as shown in FIG. 4a, indicating excellent in-plane as well as vertical packing, and hexagonal ordering. The texture observed was similar to that previously reported (Talapin et al.) and is consistent with randomly oriented superlattice domains. Following ligand displacement by the Ge—S CMC, the three-dimensional ordering was initially disturbed, as evidenced by isotropic scattering, as shown in FIG. 4b. After annealing, however, the ordering largely recovered, as shown in FIG. 4c. FIG. 4d shows I(q) vs. q plots 440 (for PbSe), 444 (for PbSe—GeS), and 448 (for PbSE-$GeS_2$) obtained by taking linecuts of the GISAXS data along the $q_y$ (horizontal) axis. Peaks 442 and 449 correspond to center-to-center spacing in the samples—10.1 nm in the nanocrystal superlattice PbSe and 7.6 nm in the nanocomposite PbSE-$GeS_2$, respectively. The presence of reflections in the two-dimensional plane suggests three-dimensional ordering, similar to the original assembly. Reduced scattering intensity is consistent with lower contrast, due to an all-inorganic composition.

Figure 5:
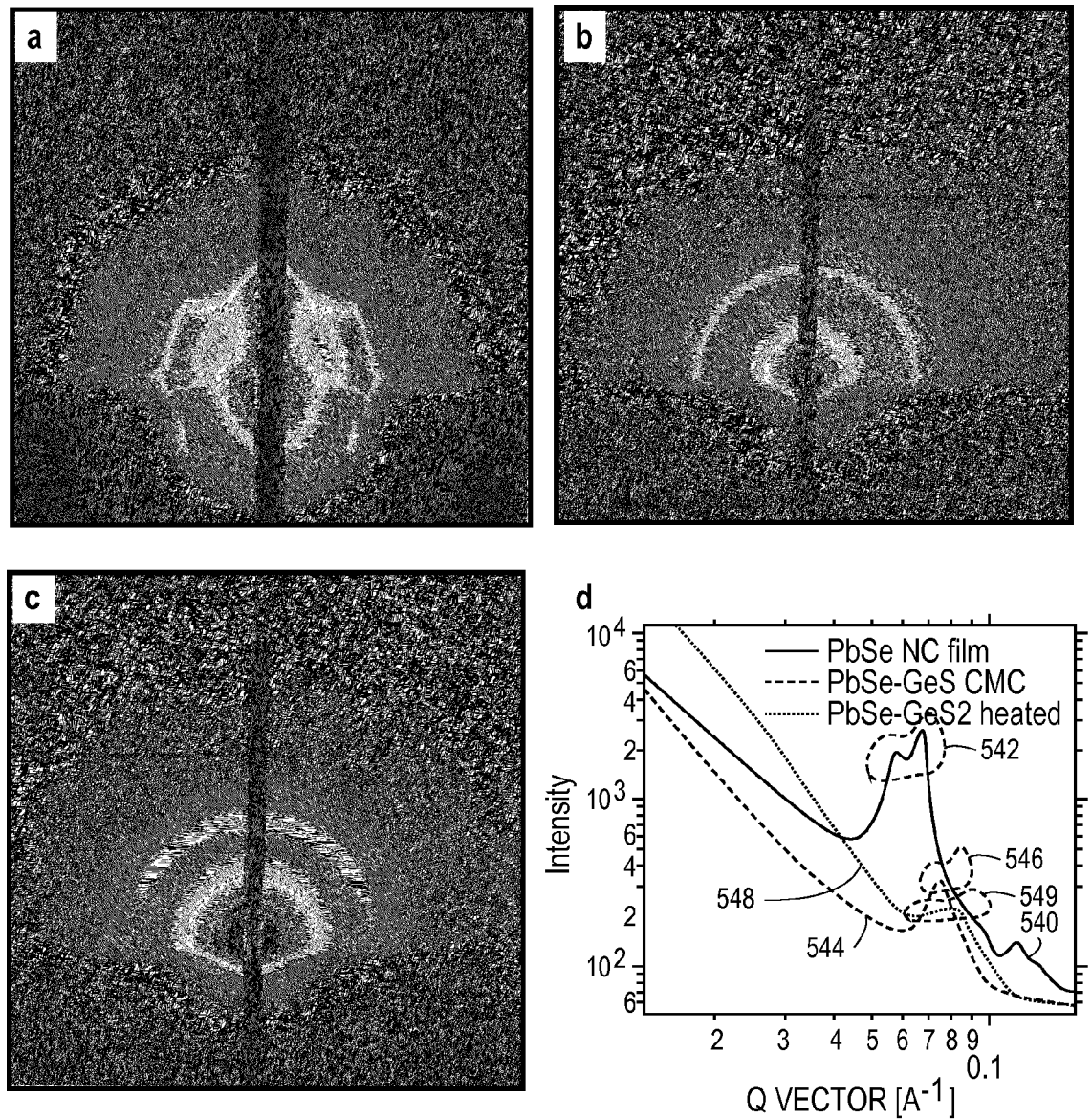
FIG. 5a is a two-dimensional GISAXS pattern from a PbSe nanocrystal superlattice produced by the present invention.
FIG. 5b is a two-dimensional GISAXS pattern from a PbSe superlattice soaked in Sb—Se CMC solution in accordance with the present invention.
FIG. 5c is a two-dimensional GISAXS pattern from a PbSe—$Sb_2Se_3$ nanocomposite after annealing in accordance with the present invention.
FIG. 5d shows I(q) vs. q plots for PbSe, for PbSe—SbSe, and for PbSe—$Sb_2Se_3$ in accordance with the present invention.

Similar results were observed for PbSe—$Sb_7Se_3$ nanocomposites, although the GISAXS pattern of these implies regular interparticle spacing, but reduced three-dimensional ordering, as shown in FIG. 5a, FIG. 5b, and FIG. 5c. FIG. 5a, FIG. 5b, and FIG. 5c show additional two-dimensional GISAXS patterns. FIG. 5d shows I(q) vs. q plots 540 (for PbSe), 544 (for PbSe—SbSe), and 548 (for PbSe—$Sb_2Se_3$) made by taking a linecut on the $q_y$ axis. Peaks 542, 546, and 549 correspond to the following center-to-center spacings: 10.1 nm in the PbSe superlattice, 8.3 nm in the precursor composite PbSe—SbSe, and 7.7 nm in the final nanocomposite PbSe—$Sb_2Se_3$, respectively.

Linecuts along the $q_y$ (horizontal) axis of the GISAXS patterns reveal the in-plane ordering, as shown in FIG. 4d and FIG. 5d. Average center-to-center distances were calculated from the resulting I(q) vs. q plots based on the $q_y$ value of the most intense off-specular reflection. The average center-to-center distance decreases upon conversion from 10.1 nm to 7.6 nm in the PbSe—$Sb_2Se_3$, composite, and 7.7 nm in the PbSe—$GeS_7$ composite, consistent with the TEM observations.

Example 2

While composites based on close-packed spheres are attractive for thermoelectrics, a vertically oriented nanorod composite may be ideal for efficient photoinduced charge separation. Heterojunctions of CdS with $Cu_2S$ are of renewed interest for photovoltaic cells. The conversion via the present invention of vertically oriented assemblies of CdS nanorods, prepared by controlled evaporation, to a nanocomposite, employing a Cu—S CMC (($Cu_7S_4$)$^{-1}$) (Milliron and Mitzi et al., *Chem. Mater.* 18, 587-590 (2006); and Mitzi, *Inorg. Chem.* 46, 926-931 (2007)) was next investigated.

Figure 6:
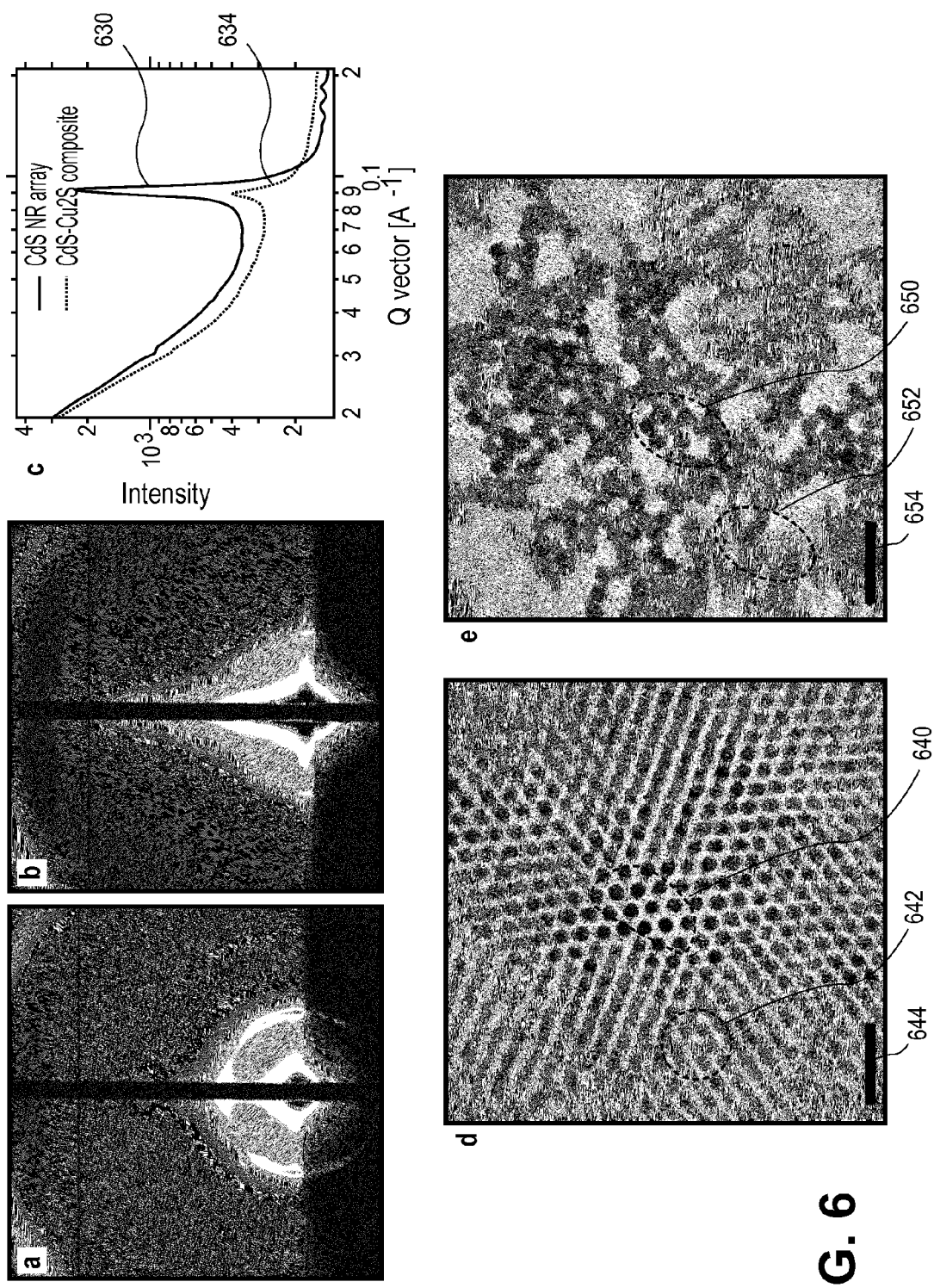
FIG. 6a is a GISAXS pattern obtained from vertically aligned CdS nanorod arrays in accordance with the present invention.
FIG. 6b is a GISAXS pattern obtained from a CdS—$Cu_2S$ composite prepared from the nanorod arrays via the present invention.
FIG. 6d is a TEM image of the original nanorod array in accordance with the present invention.
FIG. 6c shows I(g) vs. q plots for CdS and for CdS—$Cu_2S$ in accordance with the present invention.
FIG. 6e is a TEM image of a CdS—$Cu_2S$ composite made from the nanorod array via the present invention.

FIG. 6a, FIG. 6b, FIG. 6d, and FIG. 6d depict the fabrication of CdS—$Cu_2S$ nanocomposites from CdS nanorod arrays via, the present invention, GISAXS confirmed vertical orientation of the nanorods in the initial assembly, as evidenced by the truncated Bragg rods, as shown in FIG. 6a. Their slight curvature indicated that the nanorods were aligned within a range of near-vertical orientations. This was confirmed by TEM, where vertically aligned regions, such as region 640) are seen surrounded by inclined nanorods, such as shown in region 642, with hexagonal ordering, as show in FIG. 6d.

The aligned nanorod arrays were converted to a nanocomposite via the present invention by soaking in a Cu—S CMC solution, followed by annealing at 180° C. A GISAXS pattern of the resulting CdS—$Cu_2S$ nanocomposite contained reflections on the $q_y$ axis corresponding to the center-to-center spacing of the nanorods, as shown in FIG. 6b. These truncated Bragg rods, and the absence of a ring arising from isotropic nanorod orientation suggested that vertical orientation was largely retained. The shrinkage of the Bragg rods may have been caused by deterioration of in-plane ordering, as well as the decrease in the x-ray scattering contrast.

FIG. 6c show I(q) vs. q plots 630 (for CdS) and 634 (for CdS—$Cu_2S$) obtained by taking linecuts of the GISAXS data along the $q_y$ (horizontal) axis. Plotting I(q) vs. q along the $q_y$ axis reveals that the contrast is much reduced in the composite (as represented by plot 634) produced by the present invention, and the average center-to-center distance between the nanorods has slightly increased from 6.8 nm to 7.1 nm, as shown in FIG. 6c. Example 2 suggests that this slight increase reflects differences in the ligand exchange process between nanorods and nanospheres, since the ligands along the entire length between two adjacent nanorods are unlikely to be replaced concurrently.

Scale bars 644 and 654 are 20 nm each. TEM confirmed that the nanorods in the composites retained much of the vertical orientation seen in the original assemblies, similarly containing small areas of vertically aligned nanorods, as shown in region 650, surrounded by nanorods tilted or lying parallel to the surface, as shown in region 652, all as shown in FIG. 6e. The nanocomposite made via the present invention contained 8-10% Cu, and the TEM contrast between the nanorods and the inter-particle phase was dramatically reduced, similar to the nanosphere composites.

Example 3

Figure 7:
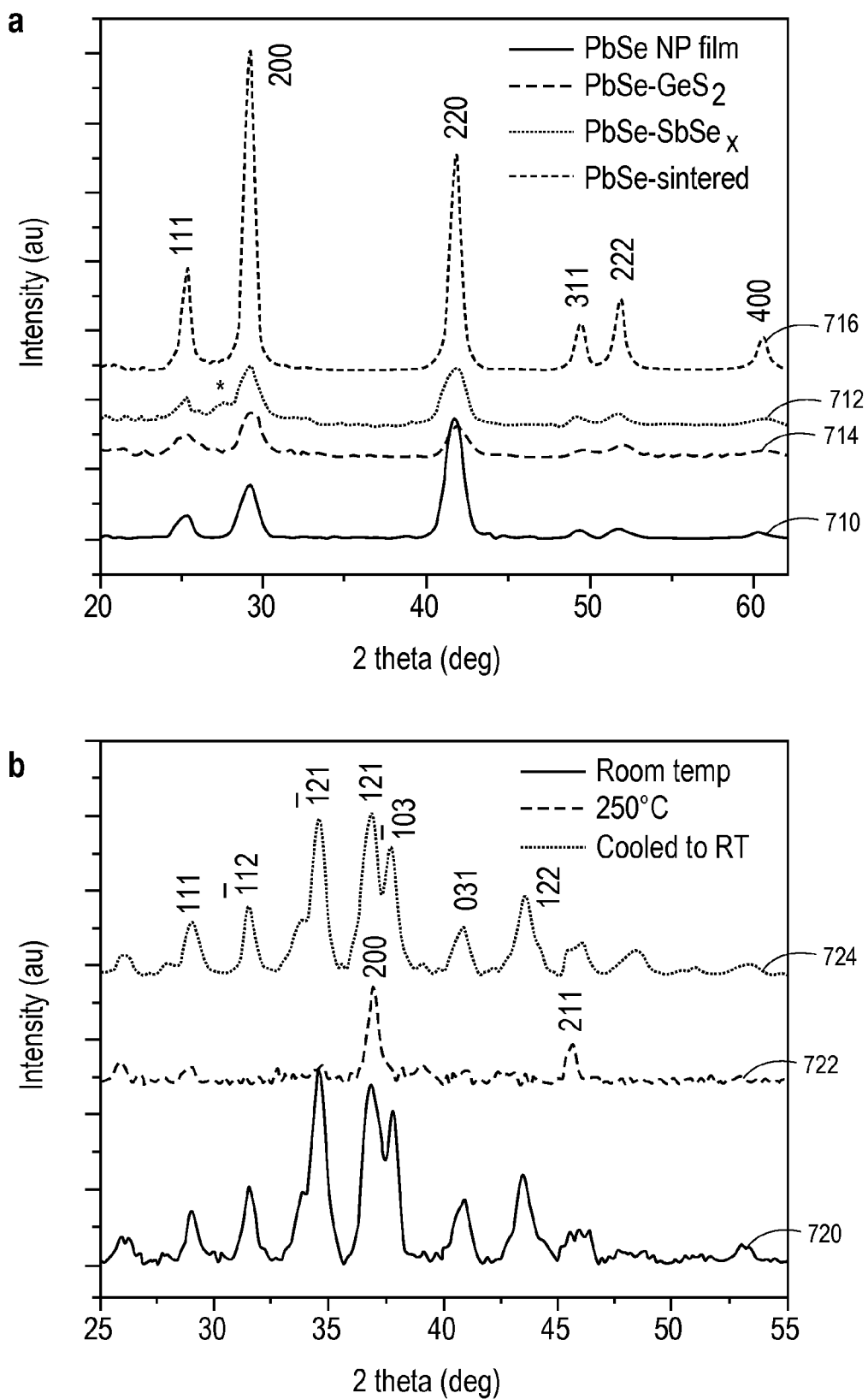
FIG. 7a shows the results of using the present invention with respect to PbSe nanocrystals.
FIG. 7b shows the results of using the present invention with respect to $Ag_2S$ nanocrystals.

In addition to their potential application as electronic materials (e.g., in transistors, photovoltaic cells, and thermoelectric devices), inorganic nanocomposites can also facilitate the investigation of temperature-dependent properties of nanomaterials. The thermal stability of the PbSe-based nanocomposites made via the present invention was confirmed by x-ray diffraction (XRD). FIG. 7a and FIG. 7b show X-ray diffraction observations of nanocomposites produced via the present invention.

The rock salt crystal structure of the nanocrystals was maintained following conversion to PbSe—$Sb_2Se_3$ and PbSe—$GeS_2$ composites via the present invention, as show in FIG. 7a. Using the Scherrer equation to calculate crystallite size from the width of the (200) reflection, it was found that the original nanocrystal size of 7 nm was approximately maintained in the annealed composites (6.6 nm). In contrast, a film of organic ligand-capped PbSe nanocrystals annealed at 200° C. sintered significantly, resulting in 14 nm crystallites. The rock salt structure and crystallite size of PbSe nanocrystals (represented by plot 710) was maintained, via the present invention, upon composite formation with $Sb_2Se_3$ (represented by plot 712) and $GeS_2$ (represented by plot 714) matrices. With no inorganic matrix present, the nanocrystals sintered upon heating, leading to larger crystallites (represented by plot 716). Only the strongest, broad peak is visible from orthorhombic $Sb_2Se_3$ in the PbSe—$Sb_2Se_3$ composite (star). Peaks were assigned according to JCPDS files 01-078-1903 for PbSe and 00-015-0861 for $Sb_2Se_3$. Thus, the presence of the inorganic matrix around the nanocrystals (a result of the applying the present invention) protected the nanocrystals in the composites (made via the present invention) from sintering.

This characteristic could facilitate the study of size-dependent properties since particle size could be maintained during thermal cycling. For example, $Ag_2S$ nanocrystals, contained within a $GeS_2$ matrix, could be cycled to 250° C., through a phase transition to the superionic cubic phase, and back again without sintering, via the present invention, as shown in FIG. 7b. 7b shows how $Ag_2S$ nanocrystals in a $Ag_2S$—$GeS_2$ nanocomposite undergo a superionic phase transition from monoclinic at room temperature (represented by plot 720) to cubic at 250° C. (represented by plot 722) and back upon cooling (represented by plot 724), without sintering, via the present invention. Peaks were assigned according to JCPDS files 00-014-0072 (monoclinic) and 01-076-0134 (cubic) $Ag_2S$. For ~10 nm particles of AgI, it was recently shown that hysteresis of the analogous phase transition stabilizes the superionic phase at room temperature (Makiura, R. et al. *Nature Mater,* 8, 476-480 (2009)). Incorporating electrochemically active nanoparticles into composites via the present invention could present a pathway for exploiting such size effects in next generation battery electrodes.

Example 4

A field-effect transistor (FET) was built using the PSe—GeS2 composite created via the present invention. Typical current-voltage (I-V) curves obtained by modulation of the gate voltage ($V_g$) for a pure PbSe nanoparticle film, and a PbSe—$GeS_2$ composite, both produced via the present invention are shown in FIG. 8a and FIG. 8b, respectively.

Figure 8A:
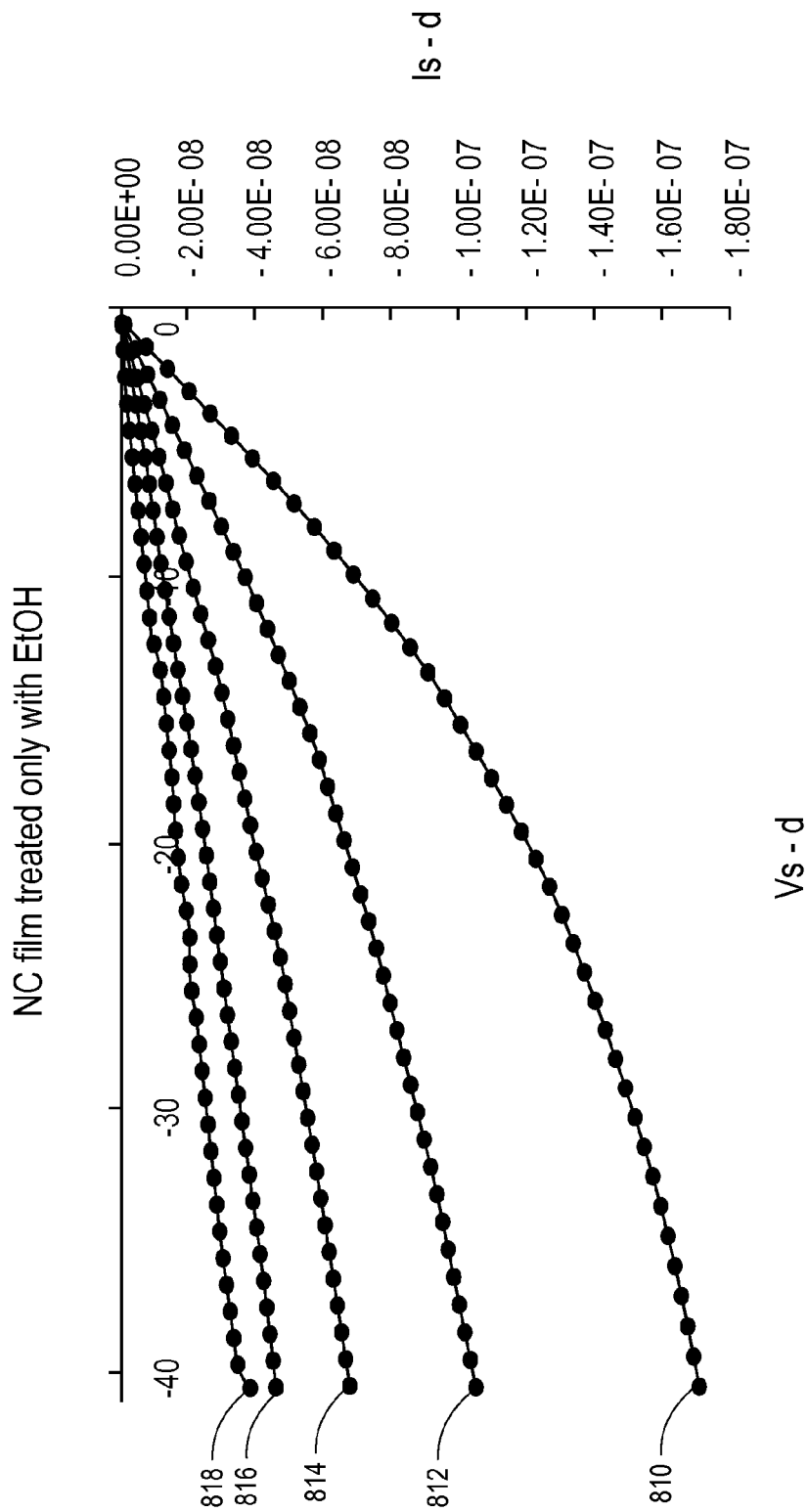
FIG. 8a shows an I-V curve for FETs fabricated from a PbSe nanocrystal array treated with ethanol via the present invention.

FIG. 8a shows an I-V curve for FETs fabricated from a PbSe nanocrystal array treated with ethanol via the present invention. Curves 810, 812, 814, 816, and 818 are at the following values of $V_g$: −40 V, −20 V, 0 V, 20 V, and 40 V, respectively.

Figure 8B:
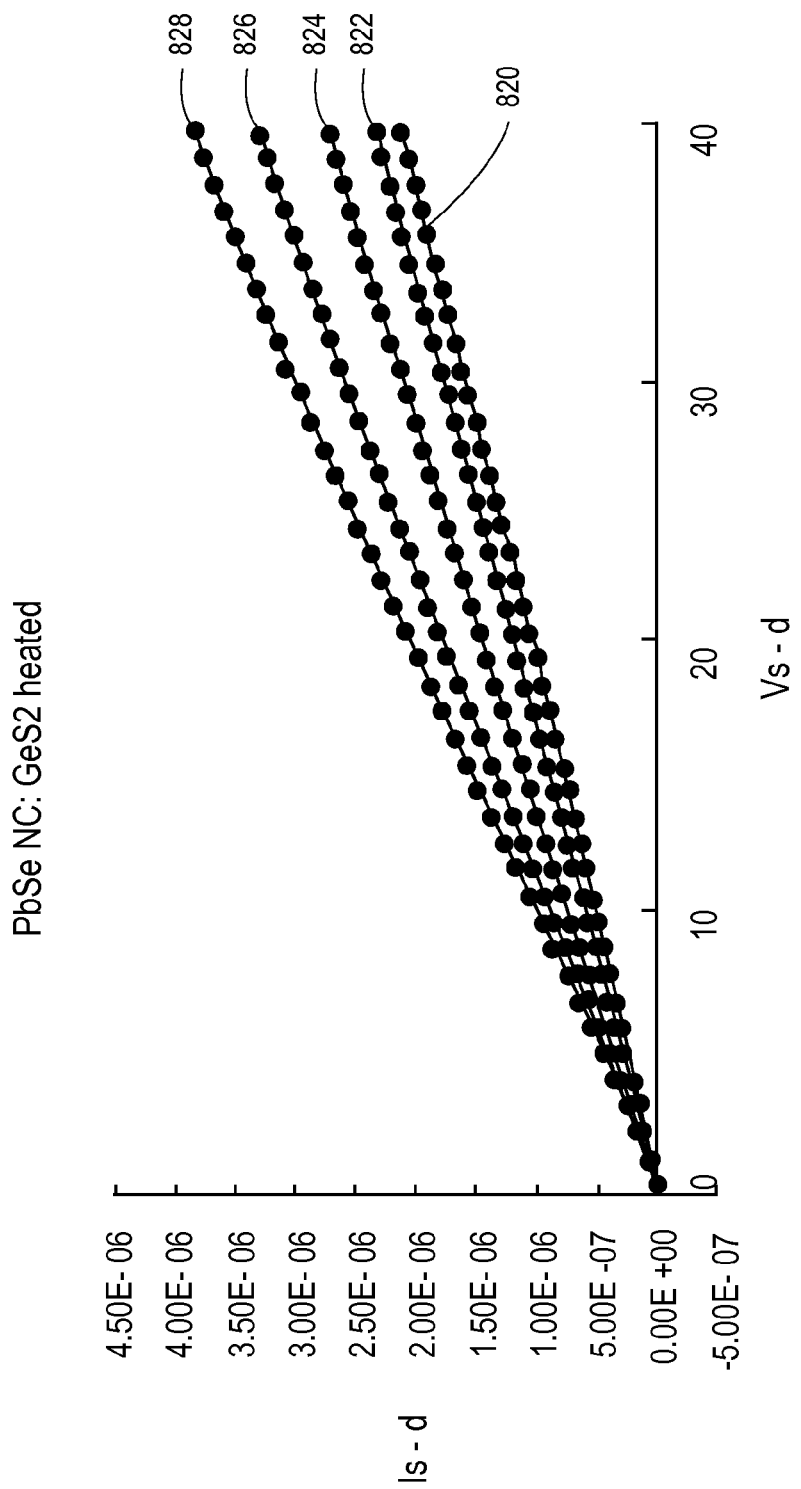
FIG. 8b shows an I-V curve for FETs fabricated from a PbSe-GeS2 nanocomposite fabricated via the present invention.

FIG. 8b shows an I-V curve for FETs fabricated from a PbSe—$GeS_2$ nanocomposite fabricated via the present invention. Curves 820, 822, 824, 826, and 828 are at the following values of $V_g$: −40 V, −20 V, 0 V, 20 V, and 40 V, respectively.

The ethanol-treated PbSe nanocrystal array exhibited p-type semiconductor behavior as the current was modulated by approximately an order of magnitude by applying different gate voltages to the back gate, as shown in FIG. 8a. In contrast, the PbSe—$GeS_2$ nanocomposite showed enhanced conductivity and n-type behavior, as shown in FIG. 8b, thereby demonstrating that highly conducting electronic materials could created via the present invention and that the fundamental nature of their electronic properties was strongly modulated by the nanocomposite structure and composition created by the present invention.

Additional Examples

The present invention was also used to make the following materials combinations (nanoparticle-matrix): $Ag_2Te$—

$GeS_2S_2$, $Ag_2Te$—$GeSe_2$, $Ag_2Te$—$In_2Se_3$, $Ag_2S$—$GeSe_2$, $SnTe$—$GeS_2$, $CdS$—$GeS_2$, $CdS$—$Sb_2Se_3$, $CdSe$—$Cu_2S$, $PbSe$—$SnS_2$, $PbSe$—$Cu_2S$, $PbSe$—$In_2Se_3$. In each case, the nanoparticles were first deposited from solution on a substrate to form a superlattice (or a vertically oriented array in the case of CdS or CdSe nanorods) via the present invention. The superlattice films were then soaked in a solution of a chalcogenidometallate cluster (CMC) in an appropriate solvent such as ethanolamine, DMSO, hydrazine, or mixtures thereof, in accordance with the present invention. The CMC replaced the organic ligands on the nanoparticle surface and acted as a precursor to the matrix phase. After 30-40 minutes of soaking, the samples were placed on a paper towel to remove excess precursor solution, then rinsed successively with ethanolamine and ethanol, in accordance with the present invention. In order to convert the intercalated CMCs to a crosslinked matrix, the samples were placed on a hot plate at 100° C. for 3 minutes, and further heated at an appropriate temperature, typically around 180° C. for 20 minutes, in accordance with the present invention. The nanocomposite samples were then characterized by SEM, TEM and x-ray diffraction.

Methods

Details of the present invention are further described below. Namely, nanocrystal syntheses, CMC syntheses, nanocomposite preparation, nanocomposite characterization, and crystallite size calculation are detailed.

Nancrystal Syntheses

PbSe nanocrystals with average size of 7 nm±0.4 nm and first absorption features at 2165 nm were synthesized from PbO and TOP—Se using a modified procedure from those taught by Steckel et al. in *J. Am. Chem. Soc.* 128, 13032-13033 (2006) and by Yu et al. in *Chem. Mater.* 16, 3318-3322 (2004). CdS nanorods, approximately 4±0.4 nm in diameter and 35±4 nm in length were synthesized from CdO and TOP—S following a procedure taught by Peng et al. in *J. Am. Chem. Soc.* 123, 183-184 (2001). $Ag_2S$ nanocrystals, approximately 8 nm in diameter were synthesized by the sulfidation Ag nanocrystals using a modified procedure taught by Wang et al. in *J. Am. Chem. Soc.* 130, 4016-4022 (2008).

Lead selenide nanocrystals with average size of 7±0.4 nm and first absorption features at 2165 nm were synthesized by standard air-free procedures (Steckel et al. and Yu et al.). Briefly, 0.892 g of PbO (99.999%), 2.825 g of oleic acid (90%), and 20 ml of 1-octadecene (90%) were heated to 170° C. in a three-neck flask under nitrogen flow for 30 minutes. 8 mL of 1M TOPSe (prepared by dissolving Se in TOP in a glovebox) was then swiftly injected at 180° C. The reaction was maintained at 158° C. for 3 minutes, and then quenched by immersing the reaction flask in a water bath. The nanocrystals were precipitated twice using anhydrous hexane and anhydrous acetone, passed through a 0.2 um filter, dispersed in hexane and stored in an inert atmosphere until further use.

Cadmium sulfide nanorods were synthesized according to the following procedure (Peng et al.) in a three-neck flask under an argon atmosphere, cadmium oxide (207 mg, 1.6 mmol), n-octadecylphosphonic acid (1.08 g, 3.2 mmol), and tri-n-octylphosphine oxide (2.75 g, 7 mmol) were degassed, then heated to 300° C. to get a colorless solution. The flask was placed under vacuum at 120° C. for 1 hour, and then reheated to 325° C. Trioctylphosphine (2 g) was injected, followed by a rapid injection of sulfur dissolved in trioctylphosphine (1.3 g, molar ratio 1:1). The temperature was reduced to 310° C. and growth maintained for 45 minutes, at which point the heating mantle was removed and the sample was allowed to cool naturally. At 80° C., anhydrous toluene was injected, and the entire solution was transferred (air-free) to a glass vial. The solution was centrifuged at 4,000 rpm for 30 minutes, and the precipitate was redispersed in toluene or hexane containing small amounts of octylamine and/or nonanoic acid. The nanorods were further purified by precipitating in isopropyl alcohol or acetone and centrifuging at 4000 rpm, followed by redispersing the precipitate in a toluene/octylamine mixture. The nanorods were typically 4 nm in diameter and 35 nm in length, with 10-12% polydispersity in both dimensions.

Silver sulfide nanocrystals were synthesized by sulfidation of Ag nanocrystals, using a modified procedure of that taught by Wang et al. 340 mg $AgNO_3$ (99.999%, 2 mmol) was added to 6 g 1-octadecylamine (98%) and heated to 160° C. under a nitrogen atmosphere. The reaction was stirred at 160° C. for two minutes to get a brown solution, and 32 mg S (1 mmol) was added. The reaction immediately turned black. After further stirring at 160° C. for 5 minutes, the reaction was cooled to ~100° C. and 7 ml toluene was added. The nanocrystals were purified by precipitating in 35 ml anhydrous ethanol and redispersing in toluene.

CMC Syntheses

Briefly, CMCs were prepared at room temperature in a nitrogen atmosphere glovebox, by dissolution of metal chalcogenides in anhydrous hydrazine in the presence of excess chalcogen. Hydrazine was distilled under nitrogen before use. Since hydrazine is highly toxic, it was handled with extreme caution in order to prevent exposure by inhalation or absorption through the skin.

The Ge—S CMC was synthesized by mixing 1 mmol (106.45 mg) of GeS with 2 mmol (64 mg) of S in 1 mL of hydrazine. The resulting colorless solution was filtered to remove any undissolved solids, and dried under nitrogen flow to yield a white crystalline powder. By analogy with a previously reported Ge—Se CMC prepared in a similar way (Mitzi, *Inorg. Chem.* 44, 3755-3761 (2005)), this compound was expected to have the chemical formula $(N_2H_4)x(N_2H_5)_4Ge_2S_6$. This compound was dissolved ethanolamine at concentrations up to 67 mg/ml prior to use for ligand exchange.

The Sb—Se and Cu—S CMCs were prepared by previously reported procedures (Milliron and Mitzi et al.; and Milliron and Raoux et al., *Nature Mater.* 6, 352-356 (2007)). For ligand exchange, solutions of the Sb—Se CMC were prepared in ethanolamine (20 mg/ml) or ethanolamine-DMSO mixtures (15 mg/ml). The Cu—S CMC was redissolved for ligand exchange by stirring with 1 equivalent of sulfur in hydrazine (20 mg/ml) or ethanolamine (~10 mg/ml) for 1-2 hours.

Molecular CMCs were prepared at room temperature in a nitrogen atmosphere glovebox, by dissolution of metal chalcogenides in anhydrous hydrazine in the presence of excess chalcogen (Milliron and Mitzi et al.; Mitzi, *Inorgan. Chem.* 46; Mitzi, *Inorg. Chem.* 44; and Milliron and Raoux et al.). The Ge—S CMC was synthesized by mixing 1 mmol (106.45 mg) of GeS with 2 mmol (64 mg) of S in 1 ml freshly distilled hydrazine and stirring for one week. The resulting colorless solution was filtered through a 0.2 μm filter to remove any undissolved solids, and dried under nitrogen flow to yield a white crystalline powder with the expected chemical formula $(N_2H_4)_x(N_2H_5)_4Ge_2S_6$. This compound was dissolved in ethanolamine at concentrations up to 67 mg/ml prior to use in ligand exchange.

The Sb—Se CMC was prepared by mixing 1 mmol (480 mg) $Sb_2Se_3$ and 2 mmol (158 mg) Se in 4 ml freshly distilled hydrazine and stirring for three days. The reddish solution was filtered and dried under nitrogen flow to yield a dark red powder. Solutions of this precursor in ethanolamine (20 mg/ml) or ethanolamine-DMSO mixtures (~15 mg/ml) were used for ligand exchange.

The Cu—S CMC was synthesized by stirring 1 mmol (159 mg) $Cu_2S$ with 2 mmol S (64 mg) in 1 ml freshly distilled hydrazine for three days. The yellow solution formed was filtered and dried under nitrogen to yield a dark crystalline powder with the chemical composition $N_4H_9Cu_7S_4$. This precursor was redissolved by stirring with 1 equivalent of sulfur in hydrazine (20 mg/ml) or ethanolamine (~10 mg/ml) for 1-2 hours.

Nanocomposite Preparation

All sample preparation was performed in a nitrogen atmosphere glovebox. PbSe or $Ag_2S$ nanocrystal films were first deposited on Si wafers containing a native oxide layer by drop-casting or spin-coating from hexane-octane (4:1 to 10:1) mixtures. For TEM, samples were prepared by drop-casting from dilute nanocrystal dispersions onto a $Si_3N_4$ window supported by a Si wafer. The films were then placed in Ge—S or Sb—Se CMC solutions for 20-40 minutes to carry out the ligand exchange.

Next, the samples were first rinsed with ethanolamine to remove excess CMC not bound to the nanocrystal surfaces, and then with ethanol to remove adsorbed ethanolamine and any remaining organic ligand. The samples were then dried either under vacuum or by gentle heating at 100° C. for three minutes. Decomposition of the precursor was carried out by annealing at 180-200° C. for 20 minutes. For GISAXS samples, the process was repeated twice to fill cracks formed in the film during ligand exchange and annealing, as well as to replenish any nanocrystals that may have been displaced from the substrate during conversion.

Vertically oriented CdS nanorod arrays were formed by controlling the drying rate of a heated nanorod solution in octane or tetrachloroethylene on a $Si_3N_4$ substrate following a procedure developed by others. Typical conditions included a solution temperature of 55° C. with 35 nm CdS nanorods dissolved in tetrachloroethylene. For TEM samples, a $Si_3N_4$ window supported by a Si wafer was used as the substrate. The nanorod arrays were then soaked in a 20 mg/ml hydrazine solution of the Cu—S CMC for 20 minutes. Alternatively the nanorod films could be soaked in a 10 mg/ml solution of the CMC in ethanolamine for 40 minutes. The samples were then sequentially rinsed with hydrazine and ethanol and dried by gentle heating at 100° C. for 3 minutes. To convert the precursor into $Cu_2S$, the sample was annealed at 180° C. for 15 minutes.

Nanocomposite Characterization

TEM was performed on a JEOL Ltd. JEOL-2100 200 kV microscope with a $LaB_6$ filament, equipped with a Gatan, Inc. camera. A Gatan, Inc. Tridiem spectrometer was used for EDS. SEM imaging was carried out on a Carl Zeiss SMT Gemini Ultra-55 Analytical Scanning Electron Microscope, using beam energies of 2-10 kV and an In-Lens detector. An inbuilt AMETEK Inc, EDAX detector was used for elemental analysis and mapping of samples. MUD was performed on a Barker AXS Gadds-8x-ray diffractometer with a Cu—Kα, source operating at 40 kV and 20 mA. GISAXS measurements were performed at beamline 7.3.3 at the Advanced Light Source, Lawrence Berkeley National Laboratory, using a ~0.5 mm wide 10 keV x-ray beam. An Area Detector System Corporation (ADSC) Quantum 4R detector was used, and image processing was done using the SAS Institute Inc, 2D program in WaveMetrics Igor-Pro.

Crystallite Size Calculation

The sizes of the PbSe crystals in the composites and sintered sample were calculated by using the Debye-Scherrer equation: $\tau = k\lambda/\beta \cos\theta$, where k is the shape factor, $\lambda$ is the x-ray wavelength used, $\beta$ is the line broadening due to the crystal size, and $\theta$ is the Bragg angle corresponding to the peak used for calculation. The 200 reflection at $2\theta=29.16°$ was used for this calculation. The line broadening was calculated using the relationship $\beta=(w^2_{exp}-w^2_{inst})^{1/2}$, where $w_{exp}$ is the experimentally measured full width at half maximum (FWHM) for the sample, and $w_{inst}$ is the FWHM value measured from a calibration sample, to account for broadening from instrumental factors. A corundum standard sample (NISI 1964) was used for measuring $w_{inst}$.

Values of $\beta$ were found to be 0.0185 rad in the initial PbSe nanocrystals, 0.019 rad for the PbSe—$GeS_2$ composite, 0.023 rad for PbSe—SbSe composite and 0.0092 rad for the sintered film. The initial nanocrystals were assumed to be single crystals, consistent with HRTEM observations, giving them a crystallite size of 7 nm. The crystallite sizes were calculated to be 6.6 mu for the PbSe—$GeS_2$ composite and 5.7 mu for PbSe—$Sb_2Se_3$ composite. For the heated PbSe film, the crystallite size was 14.1 nm Oxide-Based Inorganic Nanocomposites The component materials, nanoparticles and a precursor to the matrix, were first synthesized separately. For the metal oxide matrices, polyoxometalate clusters (POMs) (as described in Yamase, T.; *Chem. Rev,* 1998, 98, 307) were used as the precursor material. These clusters, containing a metal oxide cage and associated counterions (typically tetraalkylammonium), are commonly extremely water-soluble. In many cases, such as polyoxoniobate clusters, metal oxide cages of different sizes could be synthesized.

Metal oxide nanocomposite films were prepared by using two different ligand exchange routes: (1) ex-situ, i.e. in solution or (2) in-situ, i.e. within the film.

Ex-situ ligand exchange of the organic ligands by POMs was performed in two sequential steps. First, organic ligands were exchanged by tetrafluoroborate anions $BF_4^-$ by using a phase transfer process that enable solubility of the metal oxide nanocrystals in polar solvents—e.g. N,N-dimethylformamide (DMF). The second ligand exchange step involved aqueous transfer of the nanocrystals using $POMs.BF_4^-$ capped nanocrystals were precipitated from DMF with toluene. Then a certain volume of aqueous POM solution (niobates, 0.02M-0.05M, concentration varies depending on the targeted final volume fraction) was added to the precipitated NCs leading to an opaque slurry. After vigorously stirring the ligand exchange reaction took place leading to a clear aqueous solution. POM-ITO colloidal solution (water/ethanol (1:1) as solvent) was then deposited onto a substrate (e.g. Si, glass), which had been prepared with UV-ozone cleaning.

In-situ ligand exchange was carried out following a similar methodology previously described for the metal chalcogenide nanocomposite films. Briefly, metal oxide colloidal solutions were first deposited by drop-casting or spin-coating from hexane-octane (1:1) mixtures to form a film of assembled nanocrystals. The interparticle spacing was controlled by the monolayer of organic ligands coating their surface. These hybrid organic-inorganic films were then soaked in ethanol/water (7:3) POM solutions of (0.05M) for 15-30 minutes to promote the ligand exchange, driven by mass action. Next, the films were first rinsed with ethanol/water (7:3) to remove excess POM clusters and then with ethanol to remove any remaining organic ligand.

Following either in-situ or ex-situ ligand exchange, metal oxide nanocomposite films were obtained after annealing the POM-capped ITO nanocrystal films under variable conditions depending on the targeted metal oxide matrix. Low temperature annealing (400° C. for 20 ml) was applied to decompose POM ligands into a continuous amorphous metal oxide matrix.

The separate synthesis and processing of the nanoparticle and matrix phases enabled flexibility in choosing the composition of the nanocomposite. An additional advantage of using POMs for forming the matrix phase arises from the availability of different sized clusters, as mentioned above. For example, polyoxoniobates could be synthesized as hexaniobate $[(Nb_6O_{19})^{8-}]$ or decaniobate $[(Nb_{10}O_{28})^{6-}]$ clusters. In addition, different sized counterions, such as ammonium, hydrazinium, tetramethylammonium (or larger) could be used. The final interparticle spacing in the nanocomposite could thus be controlled, depending on the POM cluster size used. This ability to control the interparticle spacing could allow for fine tuning transport properties in nanoparticles, as well as tuning the spectral response of devices made using these nanocomposites.

Due to the large volume fraction of counterions in the POM clusters, the nanocomposite underwent substantial volume change upon thermal decomposition. Microcracks formed in the film due to this shrinkage could be beneficial for the operation of an electrochromic device, similar to that seen in U.S. Pat. No. 6,712,999. Diffusion of a liquid electrolyte into the cracks in the nanocomposite film could allow for good electronic and ionic transport and thereby efficient operation of a device. In the case that cracking is undesirable (e.g., for memory devices), repeated deposition of nanoparticles and conversion again to the nanocomposite could be used to preferentially fill such cracks (driven by capillary forces).

CONCLUSION

In summary, the present invention provides a materials-general route for fabricating modular inorganic nanocomposites by conversion of nanocrystal assemblies, including vertically aligned nanorod arrays. By decoupling the assembly and composite forming steps, the present invention enables achieving morphological as well as compositional control. The present invention greatly enhances flexibility for exploration and optimization of nanocomposite properties, and can enable the development of materials for applications that could benefit from well-controlled, chemically and morphologically tunable all-inorganic nanocomposites.

As used herein and in the appended claims, the singular forms "a", "and", and "the" include plural referents unless the context clearly dictates otherwise.

The foregoing detailed description of the present invention is provided for the purposes of illustration and is not intended to be exhaustive or to limit the invention to the embodiments and examples disclosed. Accordingly, the scope of the present invention is defined by the appended claims.

REFERENCES

1. Pileni, M. P. Nanocrystal assemblies: Fabrication and collective properties. *J. Phys. Chem. B* 105, 3358-3371 (2001).
2. Shevchenko, E. V., Talapin, D. V., Kotov, N. A., O'Brien, S. & Murray, C. B. Structural diversity in binary nanoparticle superlattices. *Nature* 439, 55-59 (2006).
3. Smith, D. K., Goodfellow, B., Smilgies, D. M. & Korgel, B. A. Self-assembled simple hexagonal AB2 binary nanocrystal superlattices: SEM, GISAXS, and defects. *J. Am. Chem. Soc.* 131, 3281-3290 (2009),
4. Cozzoli, P. D., Pellegrino, T. & Manna, L. Synthesis, properties and perspectives of hybrid nanocrystal structures. *Chem. Soc. Rev,* 35, 1195-1208 (2006),
5. Ryan, K. M., Mastroianni, A., Stancil, K. A., Liu, H. T. & Alivisatos, A. P. Electric-field-assisted assembly of perpendicularly oriented nanorod superlattices. *Nano Lett.* 6, 1479-1482 (2006).
6. Gupta, S., Zhang, Q. L., Emrick, T. & Russell, T. P. "Self-corralling" nanorods under an applied electric field. *Nano Lett.* 6, 2066-2069 (2006).
7, He, J. et al. Drying droplets: A window into the behavior of nanorods at interfaces. *Small* 3, 1214-1217 (2007).
8. Talapin, D. V. & Murray, C. B. PbSe nanocrystal solids for n- and p-channel thin film field-effect transistors. *Science* 310, 86-89 (2005).
9, Murphy, J. E., Beard, M. C. & Nozik, A. J. Time-resolved photoconductivity of PbSe nanocrystal arrays. *J. Phys. Chem. B* 110, 25455-25461 (2006).
10. Kang, B. & Ceder, G. Battery materials for ultrafast charging and discharging. *Nature* 458, 190-193 (2009).
11. Androulakis, J. et al. Spinodal decomposition and nucleation and growth as a means to bulk nanostructured thermoelectrics: Enhanced performance in $Pb_{1-x}Sn_xTe$—PbS. *J. Am. Chem. Soc.* 129, 9780-9788 (2007).
12. Badway, F., Pereira, N., Cosandey, F. &. Amatucci, G. G. Carbon-metal fluoride nanocomposites—Structure and electrochemistry of $FeF_3$:C. *J. Electrochem. Soc.* 150, A1209-A1218 (2003),
13. Fan, H. Y. et al. Self-assembly of ordered, robust, three-dimensional gold nanocrystal/silica arrays. *Science* 304, 567-571 (2004).
14. Kovalenko, M. V., Scheele, M. & Talapin, D. V., Colloidal nanocrystals with molecular metal chalcogenide surface ligands. *Science* 324, 1417-1420 (2009).
15. Milliron, D. J., Mitzi, D. B., Copel, M. & Murray, C. E. Solution-processed metal chalcogenide films for p-type transistors. *Chem. Mater.* 18, 587-590 (2006).
16. Mitzi, D. B. $N_4H_9Cu_2S_4$: A hydrazinium-based salt with a layered $Cu_2S_4$-framework, *Inorg. Chem.* 46, 926-931 (2007).
17. Steckel, J. S., Yen, B. K. H., Oertel, D. C. & Bwixendi, M. G. On the mechanism of lead chalcogenide nanocrystal formation. *J. Am. Chem. Soc.* 128, 13032-13033 (2006).
18. Yu, W. W., Falkner, J. C., Shih, B. S. & Colvin, V. L. Preparation and characterization of monodisperse PbSe semiconductor nanocrystals in a noncoordinating solvent. *Chem. Mater.* 16, 3318-3322 (2004).
19. Peng, Z. A. & Peng, X. G. Formation of high-quality CdTe, CdSe, and CdS nanocrystals using CdO as precursor. *J. Am. Chem. Soc.* 123, 183-184 (2001).
20. Wang, D. S., Xie, T., Peng, Q. & Li, Y. D. Ag, $Ag_2S$ and $Ag_2Se$ nanocrystals: Synthesis, assembly, and construction of mesoporous structures. *J. Am. Chem. Soc.* 130, 4016-4022 (2008).
21. Mitzi, D. B. Synthesis, structure, and thermal properties of soluble hydrazinium germanium(IV) and tin(IV) selenide salts. *Inorg. Chem.* 44, 3755-3761 (2005).
22. Milliron, D. J., Raoux, S., Shelby, R. & Jordan-Sweet, J. Solution-phase deposition and nanopatterning of GeSbSe phase-change materials. *Nature Mater.* 6, 352-356 (2007).
23. Tangirala, R.; Baker, J. L; Alivisatos, A. P.; Milliron, D. J.; *Angew. Chem. Mt. Ed.* 2010, 49, 2878.
24. Yamase, T.; *Chem. Rev.* 1998, 98, 307
25. Ohlin, C. A.; Villa, E. M.; Fettinger, J. C.; Casey, W. H.; *Angew. Chem. Int. Ed.* 2008, 47, 8251.

What is claimed is:

1. An inorganic nanocomposite comprising:
   a nanoparticle phase comprising nanoparticles arranged in a repeating structure; and
   an inorganic matrix phase between the nanoparticles of the nanoparticle phase,
   wherein the nanoparticle phase comprises a transparent conducting metal oxide and the matrix phase comprises a metal oxide, and wherein the inorganic nanocomposite is part of an electrochromic device.

2. The inorganic nanocomposite of claim 1 wherein the repeating structure is a close packed structure.

3. The inorganic nanocomposite of claim 1 wherein the nanoparticles comprise nanoparticles that have a spherical or pseudo-spherical shape.

4. The inorganic nanocomposite of claim 1 wherein the nanoparticles are aligned nanoparticles selected from the group consisting of nanorods, nanowires, and tetrapods.

5. The inorganic nanocomposite of claim 1 wherein the transparent conducting oxide of the nanoparticles comprises a metal selected from the group comprising Sn, Zn, and W.

6. The inorganic nanocomposite of claim 1 further comprising a substrate attached to the inorganic matrix phase.

7. The inorganic nanocomposite of claim 1, wherein the repeating structure has three-dimensional ordering.

8. The inorganic nanocomposite of claim 1, wherein the inorganic matrix phase comprises a polyoxometalate.

9. The inorganic nanocomposite of claim 1, wherein the inorganic nanocomposite is formed from:
   a superlattice of the nanoparticles arranged in the repeating structure, each nanoparticle having organic ligands attached to a surface; and
   a solution containing the metal oxide of the inorganic matrix phase, wherein the metal oxide replaces the organic ligands.

10. The electrochromic device comprising the inorganic nanocomposite of claim 1.

11. A window coating comprising the electrochromic device of claim 10.

* * * * *